US009171106B2

(12) United States Patent
Malik (10) Patent No.: US 9,171,106 B2
(45) Date of Patent: Oct. 27, 2015

(54) APPARATUS AND METHOD TO COLLECT AND CONDENSE DESIGN VIOLATIONS FROM OUTPUT DATA FILES (71) Applicant: Texas Instruments Incorporated, Dallas, TX (US)

(72) Inventor: Saqib Q. Malik, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/774,963

(22) Filed: Feb. 22, 2013

(65) Prior Publication Data

US 2013/0263071 A1  Oct. 3, 2013

Related U.S. Application Data (60) Provisional application No. 61/602,272, filed on Feb. 23, 2012.

(51) Int. Cl.
*G06F 17/50* (2006.01)

(52) U.S. Cl.
CPC .......... *G06F 17/50* (2013.01); *G06F 17/5045* (2013.01)

(58) Field of Classification Search
CPC ........... G06F 17/5031; G06F 17/5045; G06F 17/5081
USPC ......................................................... 716/106
See application file for complete search history.

(56) References Cited

U.S. PATENT DOCUMENTS

| 5,987,240 | A  | * | 11/1999 | Kay ............................... 716/112 |
| 6,868,374 | B1 | * | 3/2005  | Ditlow et al. ...................... 703/18 |
| 2004/0111685 | A1 | * | 6/2004  | Bowers et al. ..................... 716/4 |

* cited by examiner

Primary Examiner — Vuthe Siek
Assistant Examiner — Aric Lin
(74) Attorney, Agent, or Firm — Andrew Viger; Frank D. Cimino (57) ABSTRACT A method includes searching a plurality of lines of a log file for a violation of a defined condition; creating a database of all discovered violations; converting the database of all discovered to a list of output violations grouped by master; and producing a condensed summary of error messages, the producing including: searching for a selected error message; extracting a single instance or error message and load into a master log file; searching for all other examples at all levels of a hierarchical output of the list; writing a count of instances of the violation messages to the master log file; and presenting a single instance of the violations, and the count of that violation.

8 Claims, 8 Drawing Sheets

| PRIOR ART OUTPUT (N ERRORS) | NEW OUTPUT (FIRST ERROR ONLY) |
|---|---|
| ErrorA IN X1.INV1 | ErrorA IN X1.INV1 (N TIMES) |
| ErrorA IN X2.INV1 | |
| ErrorA IN X3.INV1 | |
| . | |
| . | |
| ErrorA IN XN.INV1 | |

APPARATUS AND METHOD TO COLLECT AND CONDENSE DESIGN VIOLATIONS FROM OUTPUT DATA FILES

PRIORITY

This application claims priority to U.S. Provisional Application No. 61/602,272, filed Feb. 23, 2012, entitled "Method to Collect and Condense Design Issues from Output Data Files", which is incorporated by reference in its entirety.

TECHNICAL FIELD

This application is directed, in general, to error logging and, more specifically, to simplifying error logs with multiple instances of a same violation occurring in multiple instances of the same object.

BACKGROUND

Generally, many computer tools, such as computer automated design (CAD) tools, generate information, such as compilation and run-time information, that is often repetitive and not easy to analyze.

Therefore, there is a need in the art to address at least some of the concerns regarding the prior art.

SUMMARY

A first aspect provides searching a plurality of lines of a log file for a violation of a defined condition; creating a database of all discovered violations; converting the database of all discovered to a list of output violations grouped by a master object, henceforth referred to as "master"; and producing a condensed summary of violation messages, such as error messages, in every master, the producing including: searching for a selected violation message; extracting a single instance of a violation message and loading into a master log file; searching for all other occurrences of the same message at all levels of a hierarchical output of the list; writing a count of instances of the violation messages to the master log file; and presenting a single, possibly first, instance of the violations, and the count of that violation.

A second aspect provides a method, comprising: searching a plurality of lines of a log file for a violation of a defined condition; creating a database of all discovered violations; converting the database of all discovered to a list of output violations grouped by master; and producing a condensed summary of error messages, the producing including: searching for a selected error message; extracting a first instance or error message and load into a master log file; searching for all other examples at all levels of a hierarchical output of the list; writing a count of instances of the violation messages to the master log file; and presenting the first instance of the violations, and the count of that violation; and repeating this process for at least a second master.

A third aspect provides a violation condenser for an integrated circuit (IC) comprising: a series of operating instructions stored on a computer readable storage medium that directs an operation of a processor when executed thereby, the instructions including: a master recognizer and reorganizer configured to recognize violation messages in a log file and organize them by master; a single violation extractor type per master, configured to extract a single instance of a given error type per master; and a violation type counter per master configured to count instances of a given violation per master.

BRIEF DESCRIPTION OF THE DRAWINGS

Reference is now made to the following descriptions.

DETAILED DESCRIPTION

Regarding prior art computer tools, an error list is created. Each error is recognized by the computer tool as a separate instance, and given equal emphasis.

However, it has been recognized by the present inventor that, this prior art approach creates a problem in reviewing, as this prior art approach creates confusion to a human reviewer, as many of these violations are repeats of a same error repeated multiple times for the same or different components, for example.

Figure 1:
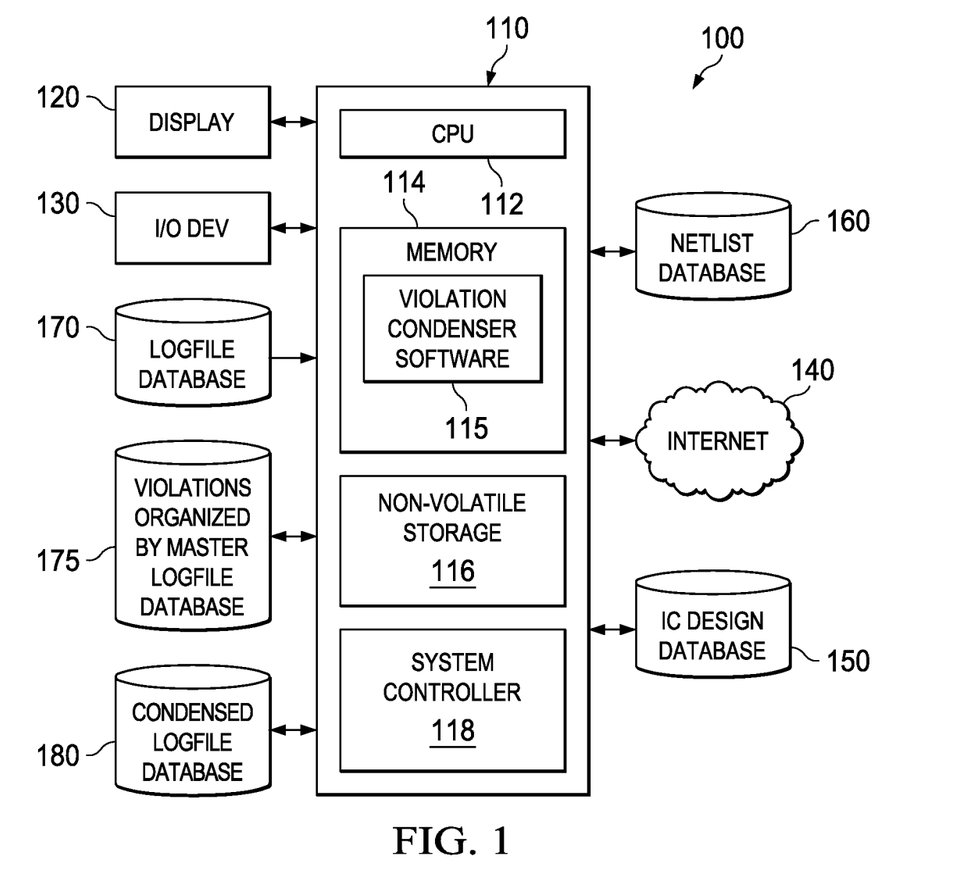
FIG. 1 illustrates on aspect of a system for condensing computer-generated violations into a form more readily understandable to a human.

According to the principles of the present application, as manifested in system 100 and the various methods and a violation condenser software 115, contrary to the approach of the conventional violation listings of computer tools, from a human perspective, not all violation listings of the same type of violation are of equal immediacy for a purpose of diagnosing violations. As a same master class of defined violation is oftentimes instantiated numerous times in a design, it is oftentimes most useful and efficient for the human to review to have a single, for example first, instance and correlated information (location, path, etc.) of that error brought to his or her attention, along with a count of the number of instances of that error. In other words, when presenting to the human for review, not all instances of that type of violation given equal listing, whereby the human review can fix the violation of the master class, thereby resolving the further violations of the same type for all instances of the master.

Generally, the present application allows for the omission of multiple repeats of a same violation message, but allows for the retention of the function of those repeated violation messages by presenting a count of those violation messages. The count can indicate, for example, an indication of the severity of the violation message. The details of each violation message is also retained and displayed to the end user upon request.

For example, CAD tools generate a lot of information that is not easy for a human to analyze. The amount of data generated can be overwhelming and potentially critical design problems are easily missed among the same repeated violation messages. Generally, the present disclosure uses algorithms to combine output from one or multiple data sources and then condense the information for easier debugging by a designer or other user. In a further aspect, data files are analyzed to find violations that are common to types of design blocks and show unique errors in each design block. A unique violation can be defined as a detection by a computer tool, such as a CAD tool of CAD design, behaving outside pre-defined acceptable boundaries. The unique violation could be a warning, an error, or just a notification of the abnormal behavior based on the definition of the acceptable boundary.

Turning to FIG. 1 illustrated is one example of a system 100 on aspect of an approach for generating a condensed list of violations, further including a count of the number of violations, from a computer-generated list of a plurality of violations that are instantiated. These violations can occur through use of a single master, such as a master component, e.g., a type of inverter. In a further aspect, in the system 100, error types are first organized by a master, such as a master component and are then condensed within each master, and a first instance of a same error type for each master, as well as a count of other instances of that error within the same master.

In the system 100, unlike the prior art, information is gathered and is condensed to show unique violations per net/instance. A unique violation is often produced by the CAD tool for behavior outside each type of pre-defined operational or design limits. For example, the CAD tool may check if the signal on a net is higher than a value MaxHI and generate a violation every time the signal is higher than MaxHI. A MaxHI violation for a given net would be unique for that net. A different but unique violation could occur if signal is less than MinLOW.

Therefore, less time is spent by a human to find all of the unique errors. Design productivity is enhanced by helping to create a quicker way to debug the design. By helping to ensure that all potential circuit issues are address by designers, first pas successful design becomes more likely. Generally, the prior art checks for unique violations at each step of a calculation. For example, a circuit simulator would check for unique violations at each new time, frequency, voltage, or other parameter variation. This linear and sequential checking results in a linear listing of oft-repeating violations. The prior art emphasizes ensuring all violations to be found and reported as they are found.

According to the manifested principles of the present application, however, this prior art information is condensed into a form more useful for a human reviewer.

The condensing system 100 includes a workstation 110, which can be a personal computer. The workstation 110 includes a CPU 112, a memory 114, a non-volatile storage 116, and a system controller 118. Please note that certain well-known aspects of workstations are not illustrated so as to help with explanation of the present application.

Memory 114 includes the violation condenser software 115. The violation condenser software 115 is used to analyze preexisting data output, examples of which are given in FIG. 2A and FIG. 2B, and run the methods 400-700, as explained in greater detail, below, to generate a condensed data output. Please note that violation condenser software 115 can be run in an integrated circuit (IC) having a series of operating instructions stored on a computer readable storage medium that directs an operation of a processor when executed thereby, such as would be found in conjunction with the CPU 112, etc.

Coupled to the workstation 110 is a display 120, and an input/output device 130, such as a keyboard, mouse, etc.

Coupled to the workstation 110 is the Internet 140. Although the various databases/output files are illustrated as coupled directly to the workstation 110, they can also couple through the Internet 140.

An integrated circuit (IC) design database 150 is coupled to the workstation 110. In the illustrated aspect a netlist database 160 is also coupled to the workstation 110, although these databases can be in alternatives to one another. A logfile database 170, holding the log file output A log file is typically generated by a CAD tool (such as a circuit simulator) and provides a record of some or all of the errors, warnings, and informational messages generated during the course of the CAD tool's operation. The log file can be generated by a CAD tool directly as a file or converted to file using input/output device 130 and is available as an input to the current art's software.

In some approaches, violations organized by master logfile database 175 is also coupled to the workstation 110, although this can be subsumed in the condensed logfile database 180. The violation condenser software 115 has parsed the output logfile, and has extracted the violations. The violation condenser software 115 then organizes the violations by masters, such as master components. In modern IC design, a block "A" with certain functionality is implemented and then re-used as often as desired. Every time the functionality of "A" is needed, a replica of "A"—called an instance—is used. Each specific instance has a unique name but is merely a copy of the "master" cell "A".

A condensed logfile database 180 is also coupled to the workstation 110. In the condensed logfile database 180, a single, for example first, instance of a violation message is stored, as determined by the violation condenser software 115, as well as a count of the recurrence of that violation message. In a further aspect, this is performed within each master. In a yet further aspect, links to the individual error messages are provided that link to the listed instance of the violation messages are provided.

Generally, the system 100 analyzes information generated by existing tools and condenses it by exploiting parallelism found commonly in modern designs. The principles of the present application allow a user or debugger to find unique violations by only showing one entry per violation for a given component. This approach can be used even if detailed information about the instance master is not available. When a database with information on each instance's master is either available or can be created, the approach collects unique violations in all instances of the same "master" component and provides a list of all types of violations for every master. "N" violations of the same type are reduced to "one" listed violation, with a count of violations, within a given master.

Figure 2A:
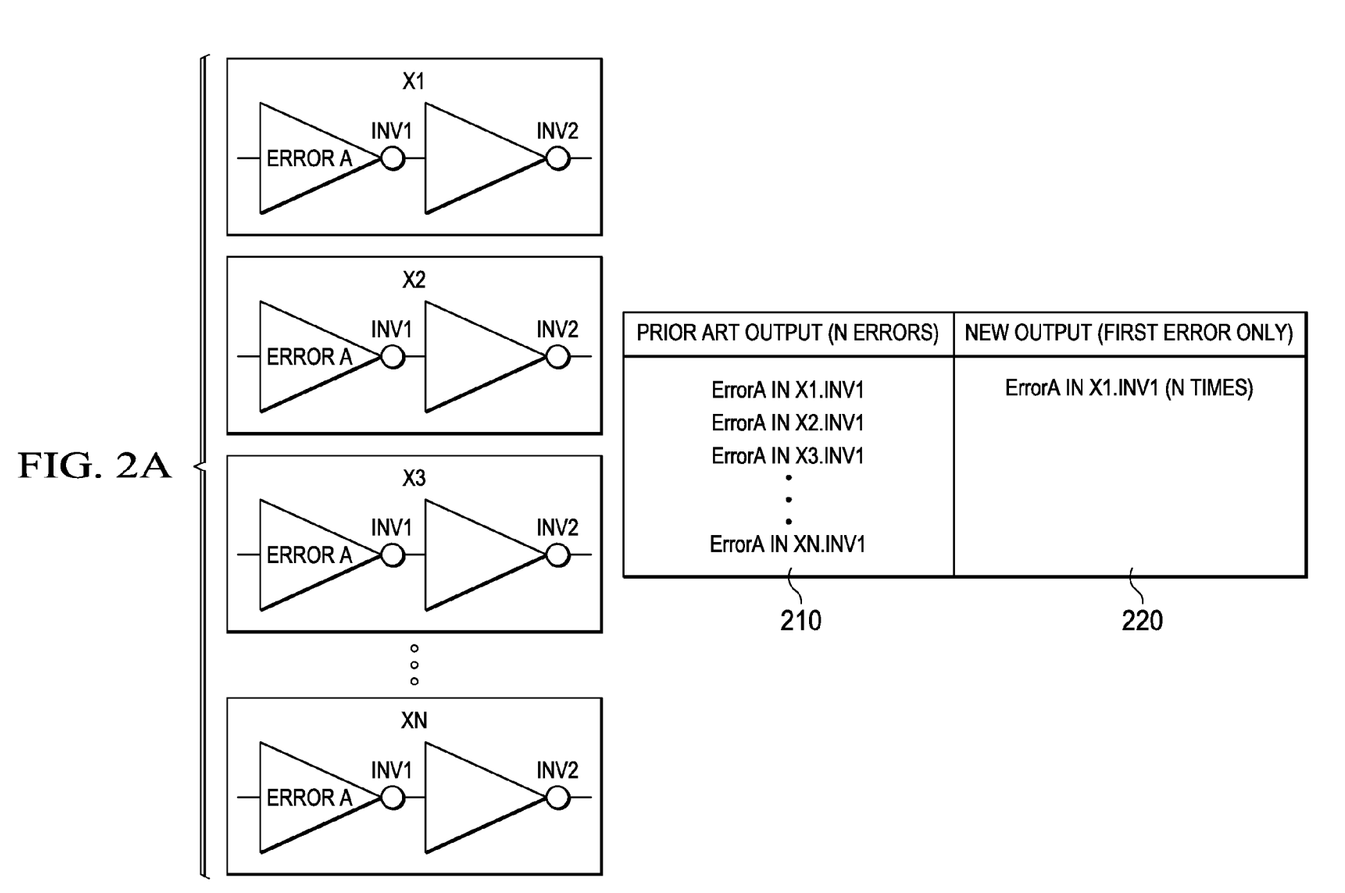
FIG. 2A illustrates a comparison of outputs between a master-organized output of violations generated by computer tools and an output of violations of the present application.

FIG. 2A illustrates an approach to listing violations 210 by a single master, one example of a listing of violations in a condensed format 220. As is illustrated, a plurality of functional blocks X1-XN are defined within a database. All of these functional blocks have an inverter one ("INV1") and an inverter two ("INV2"). However, as is illustrated, all functional blocks X1-XN each have a separate instance of the same error, "Error A." INV1 is one example of a master, and INV2 is another example of a different master.

In the illustrated example, two different masters are shown to demonstrate the technique is applicable to multiple masters and not just a single type. In this case INV1 and INV2 are instances of different masters that could differ in, say, the physical size.

In the illustrated example, as is illustrated, there are N errors in a data file output. Therefore, there would be "N"

separate listings: "ErrorA in X1.INV1"; "ErrorA in X2.INV1" and so on, such as illustrated in prior art 210.

However, in the system 100, only a single instance of ErrorA would be further output, with a count of how many additional instances of ErrorA exist, as a new file, both as determined by the violation condenser software 115.

Figure 2B:
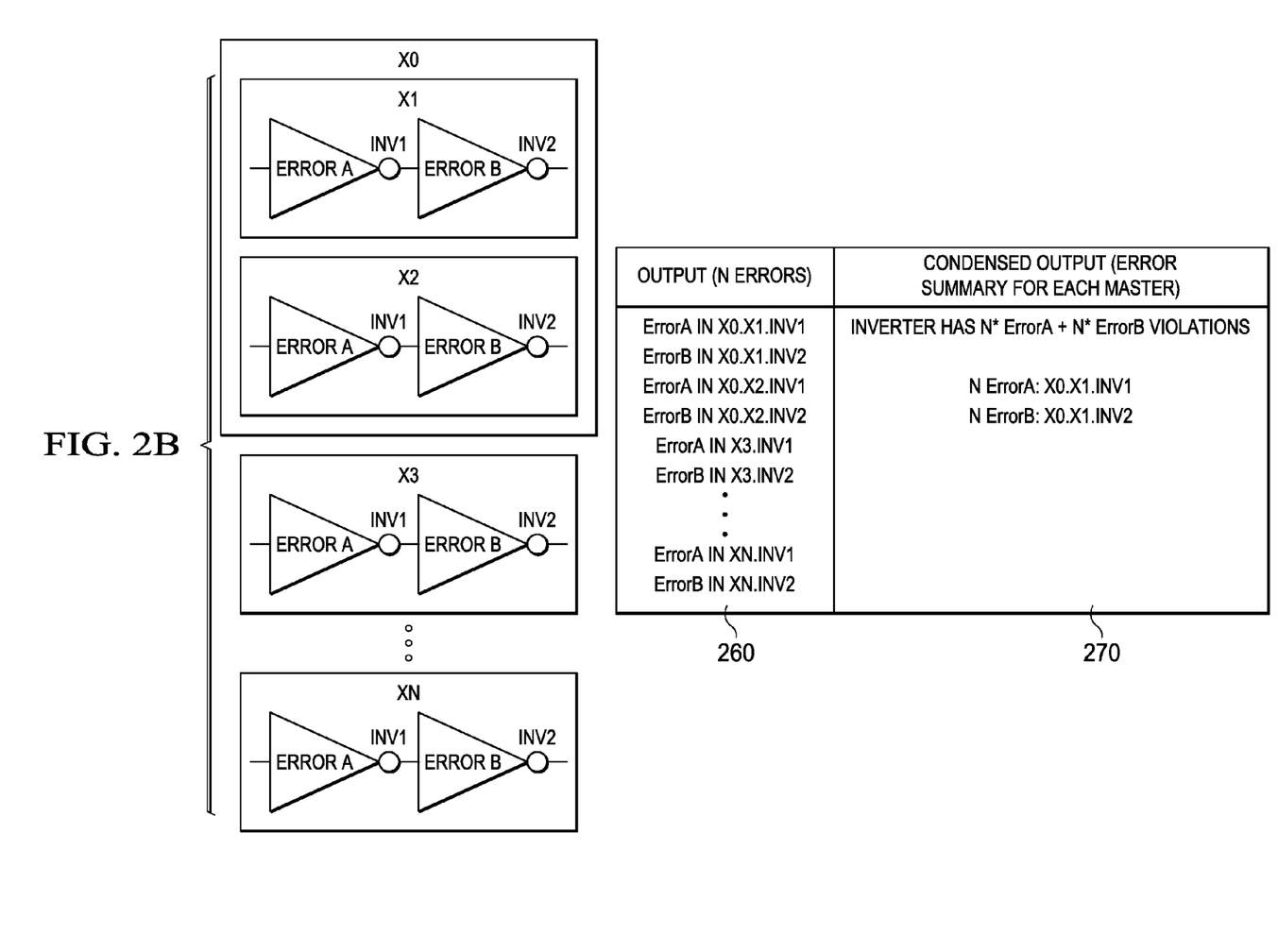
FIG. 2B illustrates an alternative comparison of outputs between a master-organized output of violations generated by computer tools and an output of violations of the present application.

FIG. 2B illustrates a further aspect of a generation of a condensed output. "INV1" and "INV2" are instantiations of the same master, an inverter, and are placements within the same components, X1-XN. Moreover, components X1-X2 are themselves within a component X0. As is illustrated, each X1-XN has an "ErrorA" and an "ErrorB".

A master-organized violation list 260 illustrates another example list of errors generated by computer tools. As is illustrated, "ErrorA" and "ErrorB" are also listed by wherein they are in a hierarchy, such as "ErrorA in X0.X2.INV1." In the example prior art list 260, as each error is listed. There are therefore 2*N errors listed.

However, in the condensed violation listing 270, as generated by the violation condenser software 150, much more elegant listing is presented. A single occurrence that may be the first or one of the N occurrences of "ErrorA," is found in X0.X1.INV1, and a single occurrence that may be the first or one of the N occurrences of ErrorB, is found in X0.X1.INV2.

Figure 2C:
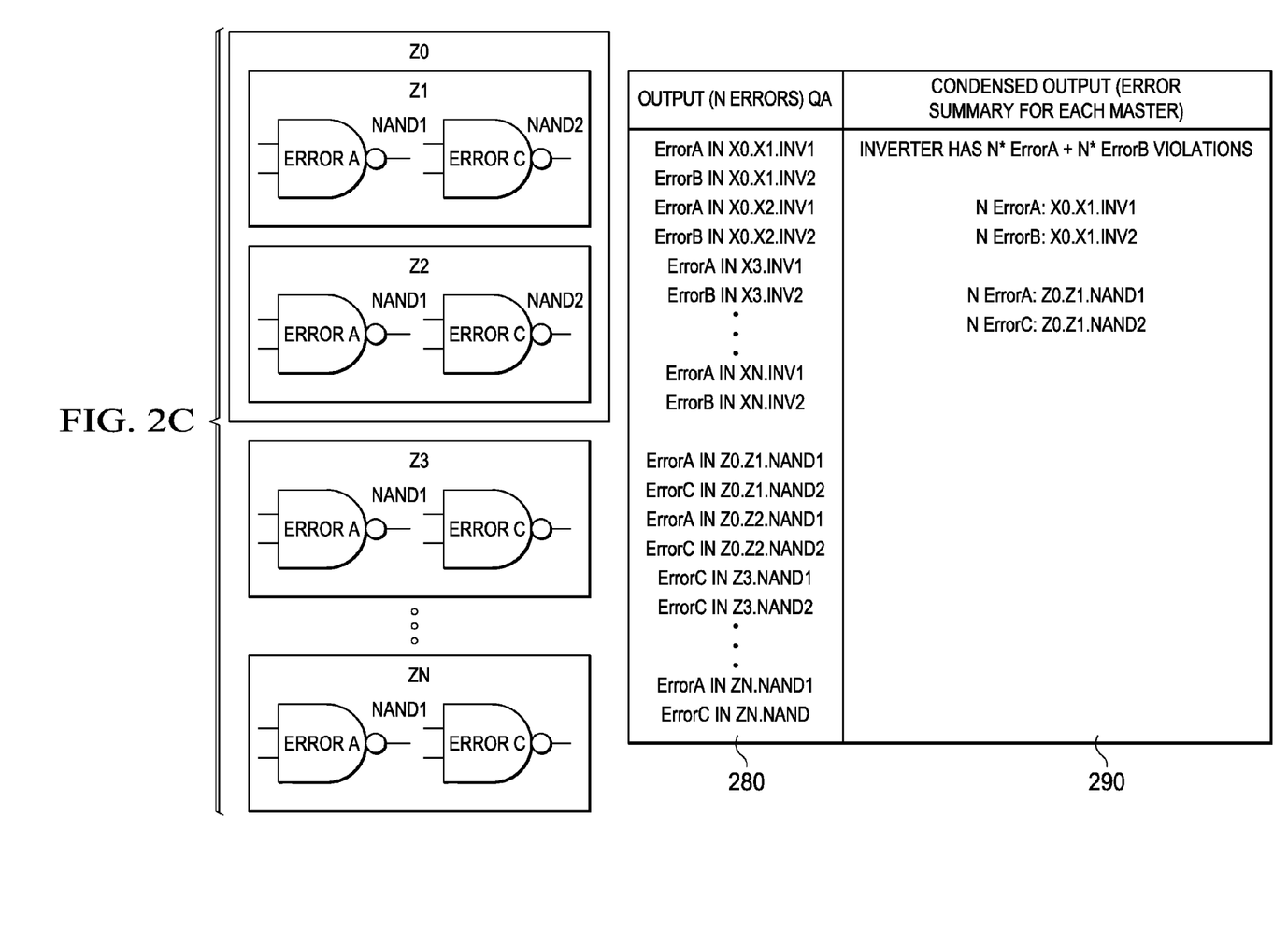
FIG. 2C illustrates a further alternative comparison of outputs between a master-organized output of violations generated by computer tools and an output of violations of the present application.

In FIG. 2C, illustrated is another example of a list of two different masters being analyzed. The violations are first grouped by master, such as can be found in the violations organized by master logfile database 175.

As is illustrated, in this aspect, the violations are grouped by master component, such as by inverter, and then by NAND gate. Each master gets its own list of errors.

With this information of a single instance, a designer can hone in on fixing the instantiation of this kind of error. Moreover, other errors that occur in the listing are more readily apparent, and hence addressable.

Figure 3:
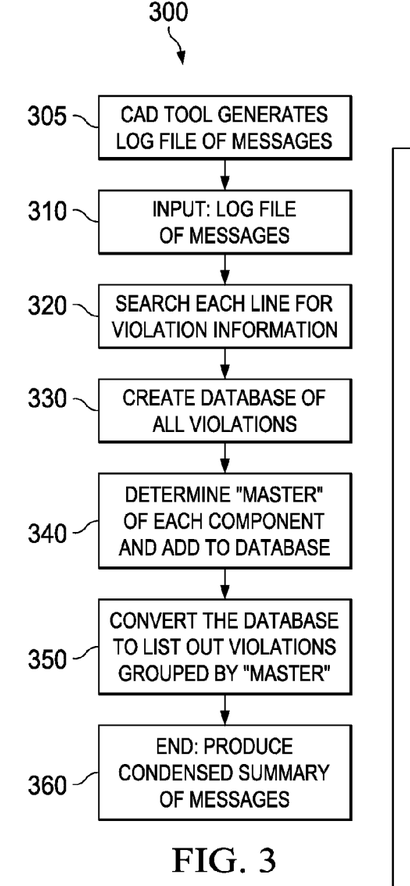
FIG. 3 illustrates a flow of a method 300 of creating a database of violations to be searched.

FIG. 3 illustrates a method 300 for generating a condensed output list according to the principles of the present application by violation condenser software 115. Please note, however, that although violation condenser software 115 is discussed as software, it can be manifested as software, hardware, firmware, or a combination of these.

In a step 310, a log file of messages, which can include violations, is generated. This can be, for example, stored in the logfile database 170. This is the prior art listing of output of a computer tool.

In a step 320, each line of the log file is searched for violation information.

In a step 330, a database/listing of all violations are created, such as in the logfile database 170.

In a step 340, in one aspect, a master of each component is determined using the IC design database 150 or a netlist database 160 and added to the violations logfile database 170. Each violation is stored in the database with its master's name.

In a step 350, the database is one aspect, organized by master for the errors, such as can be found in database 175.

In a step 360, a condensed summary of messages is created. Examples of these condensed lists have been given above.

Figure 4:
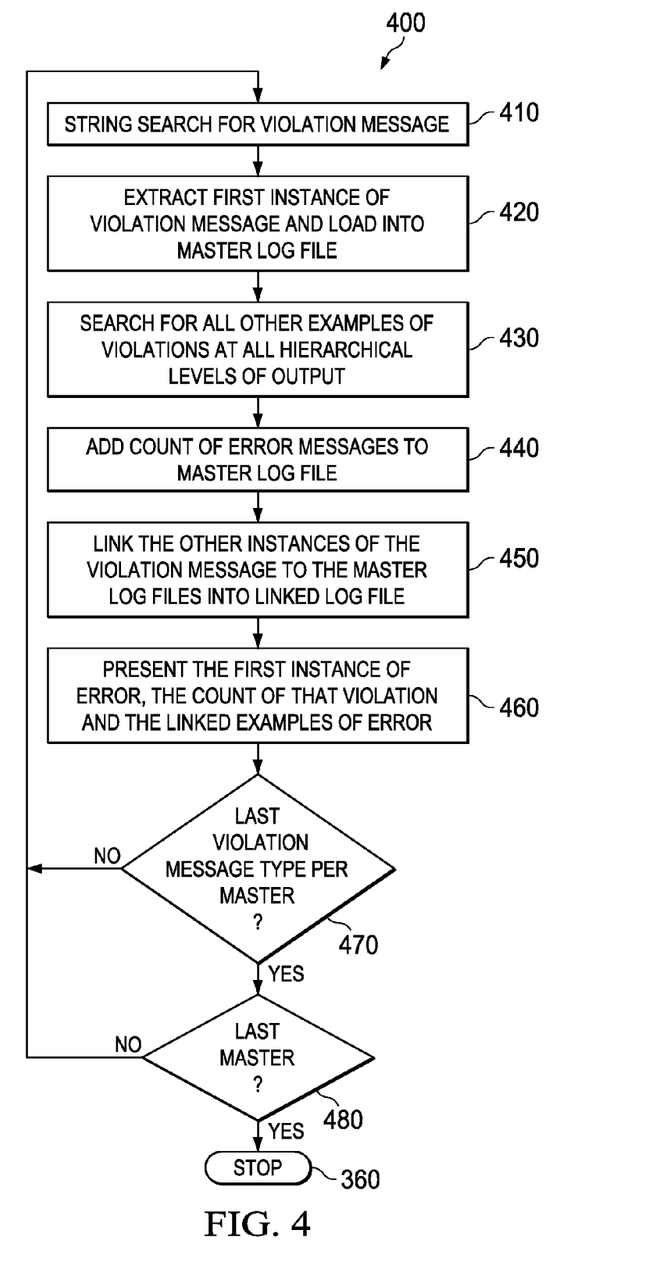
FIG. 4 illustrates a step 360 of the method 300 in more detail.

FIG. 4 illustrates step 360 of method 300 in more detail. In a step 310, a string search for a violation message occurs for a given master.

In a step 420, a first instance of the violation message is extracted and loaded into the condensed logfile database 180.

In a step 430, all occurrences of a given violation for a given master are determined and saved to the database for all levels of the hierarchy.

In a step 440, a count of all other violations for the violation type for a given master type are also added to the master log file. For example, with all the violations added to the log file database, a lookup such as the regular expression "*.INV*" would find all the messages for the cells whose names start with INV.

In a further aspect, in a step 450, the other instances of the violation message for a given master are linked.

In a step 460, a single instance of the error, and the count of the number or that types of violation, are presented for a given master, such as a component. In a further aspect, links to the other errors are also given.

In a step 470, it is determined whether the violation message is the last violation message type for a given master. If not, the method 400 loops back to step 410. If yes, the method 400 advances to a step 480.

In a step 480, it is determined whether the master component is a last master component to be reviewed. If no, step 480 loops back to step 410. If yes, the method 400 advances to the step 360 of method 300.

Figure 5:
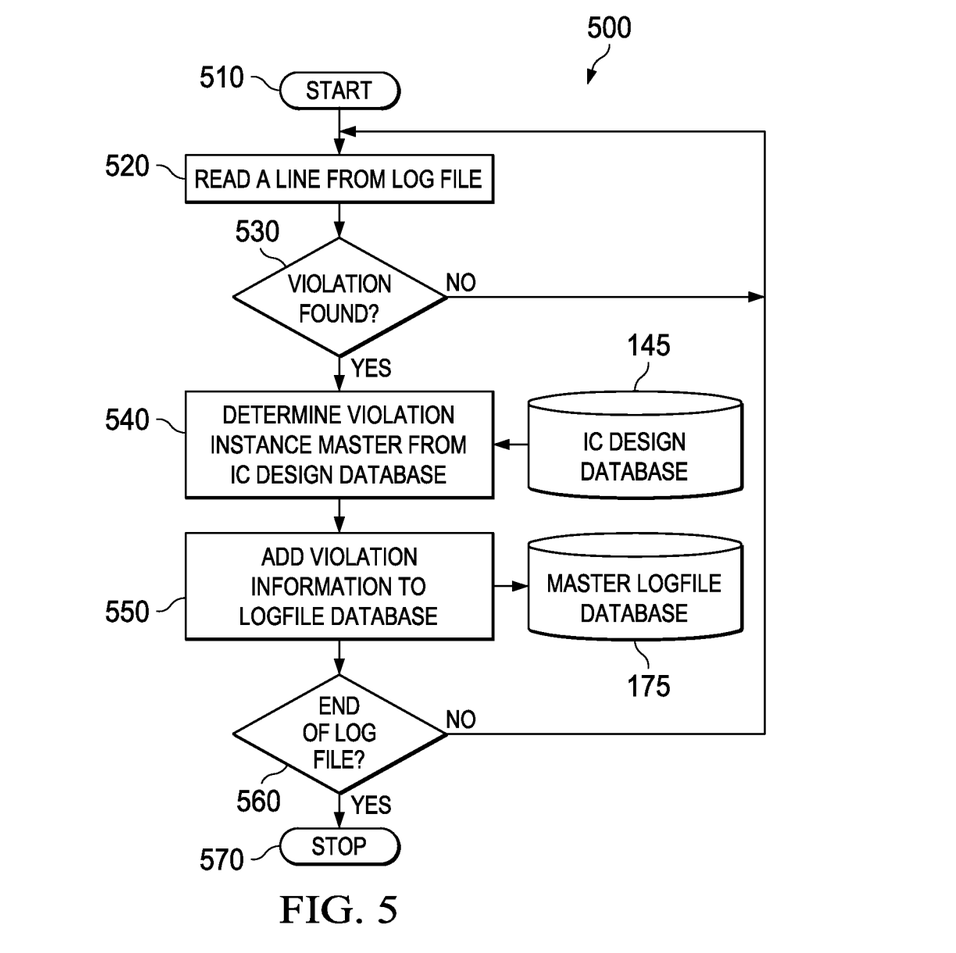
FIG. 5 illustrates a method 500 of creating a master list of error messages to be condensed when IC database is available, to be used with the method 300

FIG. 5 illustrates a method 500 for creating a log file organized by master to be condensed by the condenser software 140 when a design database is available. This can be performed by the violation condenser software 115.

After a start step 510, a line is read from a log file 520. This log file can be the output log from a CAD tool or a prior art log file.

In a step 530, it is determined if a violation is found by the violation condenser software 115. If no, loop back to 520. In yes, continue to step 540.

In a step 540, the instance master correlated to the violation is extracted from an IC design database.

In a step 550, the violation information is added to the master logfile database 175. Please note that the logfile at this point is organized by master component regarding violation messages.

In a step 560, it is determined if this is the end of the log file. If not, then the method 500 loops back to step 510. If it is the end of the file, the method 500 stops in a step 560.

Figure 6:
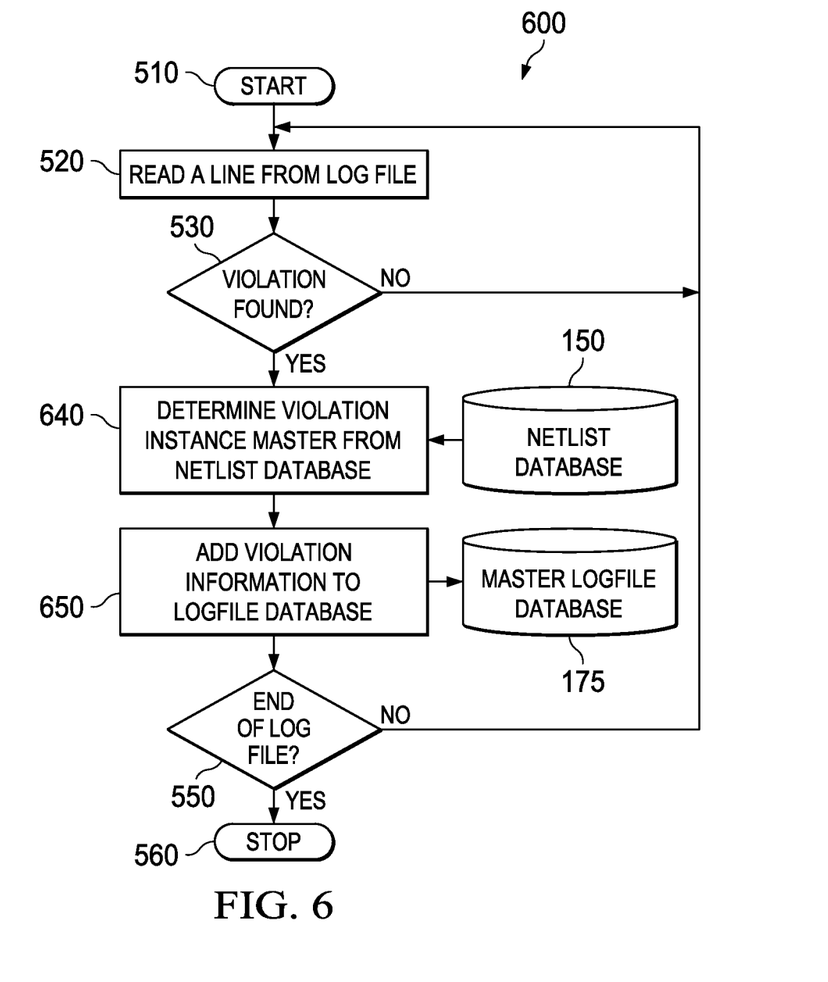
FIG. 6 illustrates a method of creating a master list of error messages to be condensed when IC database is available and instead from a netlist to be used with the method 300.

A method 600 is an alternative aspect to method 500. In method 600, a number of steps are analogous to method 500, and hence have the same number. This can be performed by the violation condenser software 115.

However, in a step 640, violation instances masters are determined from a netlist database 150, not from the IC design database.

Figure 7:
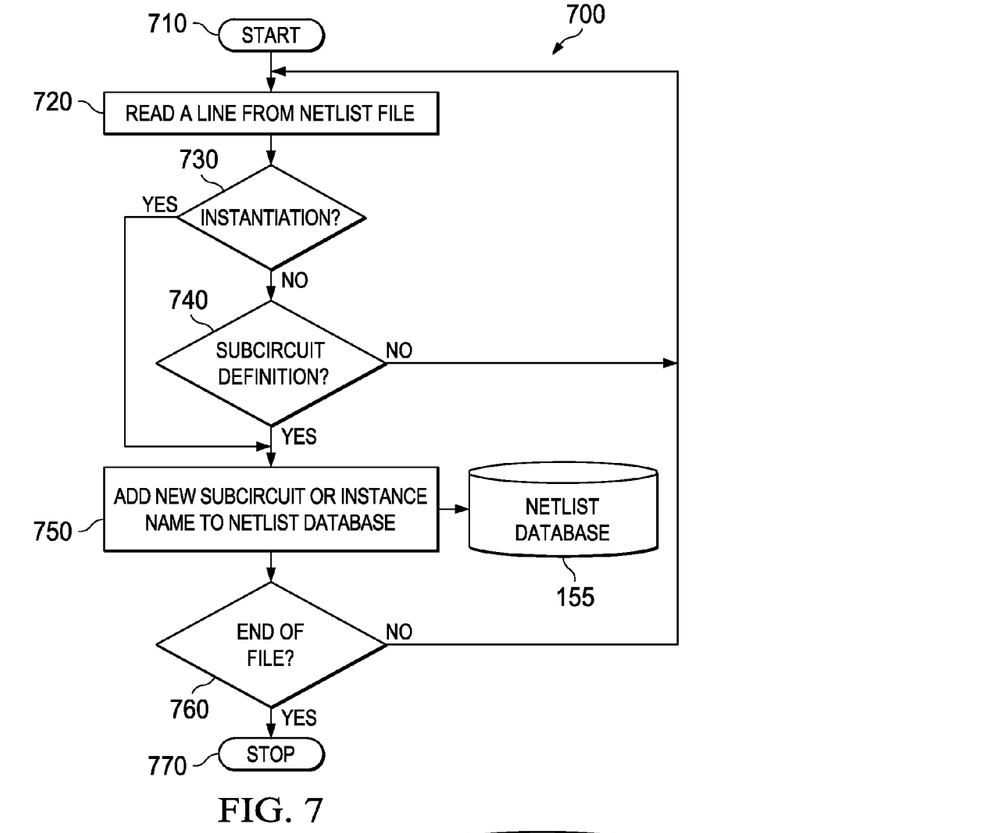
FIG. 7 illustrates a creation of a netlist to be used in the method 600.

FIG. 7 illustrates a method 700 for creating a netlist database to be used with the method 300 and the validation condensation software 115.

After a start step 710, a line of a prior art netlist file is read in a step 720.

In a step 730, it is determined if the line is an instantiation of a master. If yes, the method advances to step 750, if not, the method 700 advances to a step 740.

In the step 740, it is determined if the netlist line is a definition of a new master. If not, the method 700 loops back to step 710. If yes, the method advances to step 50.

In step 750, a new master or instance name is added to the netlist database.

In a step 760, it is determined if the end of the netlist file has been reached. If not, the method 700 loops back to step 720. If yes, the method advances to a step 770, and netlist database creation is completed.

Figure 8:
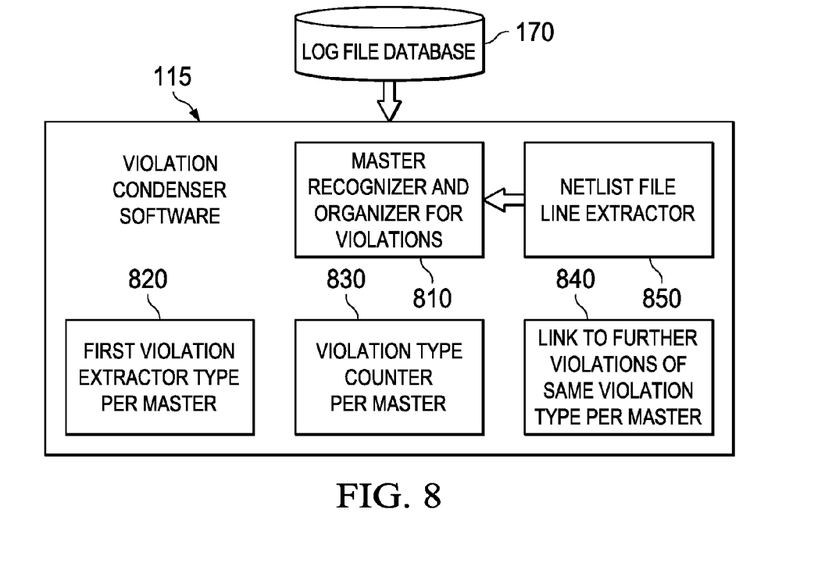
FIG. 8 illustrates an example aspect of the violation condenser software 115 of the system 100 than can be employed with the various methods of the present application.

FIG. 8 illustrates an example block diagram of the violation condenser software 115.

As is illustrated, the example violation condenser software 115 includes a master recognizer and organizer for violations 810. This block reviews and sorts a log file, and recognizes violations, and organizes them by master. This information is then stored in the master logfile 175.

A first violation extractor type per master 820 is also included. This extracts the first instance of a given error type for a master.

A violation type counter per master 830 is also included. This counts the total numbers of violations for a given violation type for a given master.

In a further embodiment, a netlist file line extractor 850 is included. This creates a log file from a netlist that can then be reorganized by the master recognizer and organizer for violations 810.

Please note the preceding violation condenser software can be run on an integrated circuit (IC), then software comprising: a series of operating instructions stored on a computer readable storage medium that directs an operation of a processor when executed thereby.

Also, please note that the terms "error", "warning" and "violation" have been used interchangeably throughout this specification.

Those skilled in the art to which this application relates will appreciate that other and further additions, deletions, substitutions and modifications may be made to the described embodiments.

What is claimed is:

1. A method, comprising:
   storing in an IC (integrated circuit) design database, an IC design that includes a plurality of master circuits, at least some including a plurality of instances of the master circuit instantiated within components, wherein at least some of the components are arranged in a component hierarchy;
   accessing the IC design database and generating a log file of hardware violations of one or more defined hardware design violation conditions associated with each instantiation of at least some of the master circuits;
   converting the log file of all discovered hardware violations to a master log file with a list of hardware violations grouped by the associated master circuit;
   producing a condensed log file database by:
      searching the master log file for each hardware violation for each master circuit within each component, including if applicable within a component hierarchy;
      extracting a first instance of such hardware violation for each master circuit;
      generating a count of all instances of the hardware violation for each master circuit;
      arranging the condensed log file according to the extracted first instances of each hardware violation for each master circuit, with the associated count of that hardware violation; and
      storing the condensed log file in the condensed log file database.

2. The method of claim 1, wherein each line of the plurality of lines of the log file database of hardware violations are searched.

3. The method of claim 1, wherein at least some of the hardware violations are a repeat of a hardware violation within different instances of the same master circuit.

4. The method of claim 1, further comprising including within the condensed log file database a plurality of different types of hardware violation presented in connection with a single master circuit.

5. A method useable with an IC (integrated circuit) design database that stores an IC design that includes a plurality of master circuits, at least some including a plurality of instances of the master circuit instantiated within components, wherein at least some of the components are arranged in a component hierarchy, comprising:
   accessing the IC design database and generating a log file of hardware violations of one or more defined hardware design violation conditions associated with each instantiation of at least some of the master circuits
   converting the log file of all discovered hardware violations to a master log file with a list of hardware violations grouped by the associated master circuit;
   producing a condensed log file database by:
      searching the master log file for each hardware violation for each master circuit within each component, including if applicable within a component hierarchy;
      extracting a first instance of such hardware violation for each master circuit;
      generating a count of all instances of the hardware violation for each master circuit;
      arranging the condensed log file according to the extracted first instances of each hardware violation for each master circuit, with the associated count of that hardware violation; and
      storing the condensed log file in the condensed log file database.

6. The method of claim 5, wherein at least some of the hardware are a repeat of a hardware within different instances of the same master circuit.

7. The method of claim 5, further comprising linking other instances of the hardware violation to the first instances of the hardware violation.

8. The method of claim 5, further comprising including within the condensed log file the linked other instances of the hardware violation.

* * * * *